United States Patent
Rodney et al.

(10) Patent No.: US 8,981,586 B2
(45) Date of Patent: Mar. 17, 2015

(54) SYSTEMS AND METHODS TO HARVEST FLUID ENERGY IN A WELLBORE USING PRELOADED MAGNETOSTRICTIVE ELEMENTS

(75) Inventors: Paul F. Rodney, Spring, TX (US); Michael Fripp, Carrollton, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 38 days.

(21) Appl. No.: 14/001,548

(22) PCT Filed: Mar. 6, 2012

(86) PCT No.: PCT/US2012/027891
§ 371 (c)(1),
(2), (4) Date: Aug. 26, 2013

(87) PCT Pub. No.: WO2012/122173
PCT Pub. Date: Sep. 13, 2012

(65) Prior Publication Data
US 2013/0328316 A1  Dec. 12, 2013

Related U.S. Application Data

(60) Provisional application No. 61/451,253, filed on Mar. 10, 2011.

(51) Int. Cl.
*F03B 13/00* (2006.01)
*H02P 9/04* (2006.01)
(Continued)

(52) U.S. Cl.
CPC .......... *H02K 57/003* (2013.01); *E21B 41/0085* (2013.01); *G01F 1/115* (2013.01); *G01F 1/3209* (2013.01); *G01F 1/3263* (2013.01);
(Continued)

(58) Field of Classification Search
USPC ........... 290/1 R, 54; 166/249; 310/26; 367/82
See application file for complete search history.

(56) References Cited

U.S. PATENT DOCUMENTS 2,116,522 A * 5/1938 Kunze ............................ 367/168
2,947,890 A * 8/1960 Harris et al. .................... 310/26
(Continued)

FOREIGN PATENT DOCUMENTS

| NO | WO2009/123466 A1 | 10/2009 |
| WO | 2007/071975 A1 | 6/2007 |
| WO | 2009/123466 A1 | 10/2009 |

OTHER PUBLICATIONS

International Preliminary Report on Patentability, International Application No. PCT/US2012/027891, mailed Sep. 19, 2013, 6 pages.
(Continued)

*Primary Examiner* — Pedro J Cuevas
(74) *Attorney, Agent, or Firm* — Benjamin Fite; Baker Botts L.L.P.

(57) ABSTRACT

A magnetostrictor assembly (100) includes a magnetostrictor element (105), a conductor coupled to the magnetostrictor element, and a bluff body (101) coupled to the magnetostrictor element via a transfer arm (103). The bluff body is to be placed in a fluid flow path to, at least in part, produce motion that, at least in part, causes strain in the magnetostrictor element. A preload mechanism comprising a control circuit (1100) may optimize a magnetostrictive generator.

17 Claims, 6 Drawing Sheets

(51) Int. Cl.
   H02K 99/00    (2014.01)
   E21B 41/00    (2006.01)
   G01F 1/115    (2006.01)
   G01F 1/32     (2006.01)
   H01L 41/12    (2006.01)
   H02N 2/18     (2006.01)
   F03B 17/00    (2006.01)
   F02B 63/04    (2006.01)

(52) U.S. Cl.
   CPC ............ *H01L41/125* (2013.01); *H02N 2/185* (2013.01); *F03B 17/00* (2013.01)
   USPC ............... 290/54; 290/1 R; 166/249; 310/26; 367/82

(56) References Cited

U.S. PATENT DOCUMENTS

| | | | | |
|---|---|---|---|---|
| 3,109,973 A * | 11/1963 | Harris | ............... | 318/118 |
| 3,161,792 A * | 12/1964 | Wright | ............... | 310/26 |
| 3,612,924 A * | 10/1971 | Semmelink | ............... | 310/16 |
| 4,161,665 A * | 7/1979 | Buck et al. | ............... | 310/26 |
| 4,297,602 A * | 10/1981 | Kobayashi et al. | ............... | 310/26 |
| 4,757,219 A * | 7/1988 | Yamauchi et al. | ............... | 310/26 |
| 4,869,349 A * | 9/1989 | Minear et al. | ............... | 181/102 |
| 5,115,880 A * | 5/1992 | Sallas et al. | ............... | 181/106 |
| 5,128,900 A * | 7/1992 | Cole | ............... | 367/75 |
| 5,128,901 A * | 7/1992 | Drumheller | ............... | 367/82 |
| 5,128,902 A * | 7/1992 | Spinnler | ............... | 367/82 |
| 5,159,226 A * | 10/1992 | Montgomery | ............... | 310/333 |
| 5,166,908 A * | 11/1992 | Montgomery | ............... | 367/165 |
| 5,222,049 A * | 6/1993 | Drumheller | ............... | 367/82 |
| 5,274,606 A * | 12/1993 | Drumheller et al. | ............... | 367/82 |
| 5,406,153 A * | 4/1995 | Flatau et al. | ............... | 310/26 |
| 5,465,015 A * | 11/1995 | Anastas et al. | ............... | 310/26 |
| 5,585,772 A * | 12/1996 | Joshi et al. | ............... | 335/215 |
| 5,850,109 A * | 12/1998 | Mock et al. | ............... | 310/26 |
| 6,012,521 A * | 1/2000 | Zunkel et al. | ............... | 166/249 |
| 6,230,799 B1 * | 5/2001 | Slaughter et al. | ............... | 166/249 |
| 6,515,382 B1 * | 2/2003 | Ullakko | ............... | 310/26 |
| 6,694,822 B1 * | 2/2004 | Ganapathi et al. | ............... | 73/763 |
| 7,073,397 B2 * | 7/2006 | Ganapathi | ............... | 73/862.046 |
| 8,056,827 B2 * | 11/2011 | Xu | ............... | 239/102.1 |
| 8,823,221 B1 * | 9/2014 | Teter | ............... | 310/26 |
| 2004/0202047 A1 * | 10/2004 | Fripp et al. | ............... | 367/81 |
| 2005/0230973 A1 | 10/2005 | Fripp et al. | ............... | 290/1 R |
| 2005/0230974 A1 | 10/2005 | Masters et al. | ............... | 290/1 R |
| 2006/0230841 A1 | 10/2006 | Shrikrishna | ............... | 73/861.24 |
| 2011/0316362 A1 | 12/2011 | Nair | ............... | 310/26 |
| 2012/0056432 A1 | 3/2012 | Nair | ............... | 290/53 |
| 2013/0033130 A1 | 2/2013 | Nair | ............... | 310/26 |
| 2013/0343918 A1 * | 12/2013 | Fripp et al. | ............... | 417/53 |

OTHER PUBLICATIONS

International Search Report and Written Opinion, International Application No. PCT/US2012/027891, 11pgs., Mar. 8, 2013.

* cited by examiner

SYSTEMS AND METHODS TO HARVEST FLUID ENERGY IN A WELLBORE USING PRELOADED MAGNETOSTRICTIVE ELEMENTS

CROSS-REFERENCE TO RELATED APPLICATIONS

This application is a U.S. National Stage Application of International Application No. PCT/US2012/027891 filed Mar. 6, 2012, which claims the benefit of U.S. Provisional Application No. 61/451,253, which was filed Mar. 10, 2011, and which are hereby incorporated by reference in their entirety.

BACKGROUND

The present disclosure relates generally to wellbore operations and, more particularly, to systems and methods to efficiently harvest fluid energy or mechanical energy imparted to a drillstring in a wellbore using preloaded magnetostrictive elements.

Power for use in a downhole environment in the past has generally been either stored in a device, such as a battery, and conveyed downhole or generated downhole by an alternator driven, such as by the flow of drilling mud, or it has been transmitted via conductors, such as a wireline, from the earth's surface or another remote location. As is well known, batteries have the capability of storing only a finite amount of power therein and have environmental limits, such as temperature, on their use.

Electrical conductors, such as those in a conventional wireline, provide a practically unlimited amount of power, but require special facilities at the surface for deployment and typically obstruct the production flowpath, thereby preventing the use of safety valves, limiting the flow rate of fluids through the flowpath, etc. while the conductors are in the flowpath. Thus, wireline operations are typically carried out prior to the production phase of a well, or during remedial operations after the well has been placed into production.

In wellbore operations, it is desirable to provide one or more efficient power sources downhole, for example, to power downhole instrumentation. A wide variety of fluids may be used in downhole operations and may be pumped artificially or flow naturally through numerous tubing structures. Existing downhole generators—such as an alternator driven by mudflow, as mentioned earlier—are limited in that they cannot operate at whatever speed is dictated by the fluid flow, because doing so would produce too much power, causing a heat build-up which may damage electrical components. Additionally, existing downhole generators cannot be optimized during operation to maximum power generation when operating conditions change. What is needed is a method for efficiently generating electrical energy from downhole energy sources using a variable and optimizable generator.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features.

Figure 1:
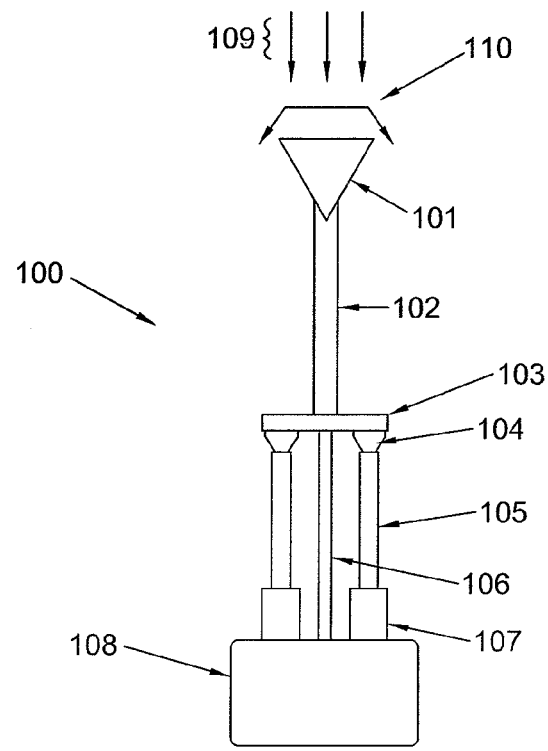
FIG. 1 is an illustration of an example magnetostrictor assembly incorporating aspects of the present disclosure.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

The present disclosure relates generally to wellbore operations and, more particularly, to systems and methods to efficiently harvest fluid energy in a wellbore using preloaded magnetostrictive elements.

Illustrative embodiments of the present disclosure are described in detail herein. In the interest of clarity, not all features of an actual implementation may be described in this specification. It will of course be appreciated that in the development of any such actual embodiment, numerous implementation-specific decisions must be made to achieve the specific implementation goals, which will vary from one implementation to another. Moreover, it will be appreciated that such a development effort might be complex and time-consuming, but would nevertheless be a routine undertaking for those of ordinary skill in the art having the benefit of the present disclosure.

To facilitate a better understanding of the present disclosure, the following examples of certain embodiments are given. In no way should the following examples be read to limit, or define, the scope of the disclosure. Embodiments of the present disclosure may be applicable to horizontal, vertical, deviated, or otherwise nonlinear wellbores in any type of subterranean formation. Embodiments may be applicable to injection wells as well as production wells, including hydrocarbon wells. Devices and methods in accordance with certain embodiments may be used in one or more of wireline, measurement-while-drilling (MWD) and logging-while-drilling (LWD) operations.

In certain embodiments according to the present disclosure, electrical power may be generated downhole by converting fluid flow energy to electrical energy using magnetostrictor elements. The magnetostrictor elements may be subjected to variable biasing forces, which can be used to optimize the efficiency of the magnetostrictor elements or to protect against damage to electrical elements by the overproduction of power.

Magnetostrictor materials have the ability to convert elastic energy into magnetic energy that may be used to generate electrical power. Magnetostrictor materials have the property that, when strain is induced in the material, the change in linear dimensions produces a corresponding change in magnetic field about the material. In other words, mechanical loads can deform the material and thereby rotate magnetic domains. The change of the magnetic flux can be used to generate electrical power. A suitable material for the magnetostrictor material may be Terfenol-D, available from Etrema Products, Inc. Various materials, e.g., iron and iron alloys such as Terfenol, may provide suitable magnetostrictor and giant magnetostrictor responses. Polycrystaline, single crystal, amorphic, and other grain structures may be used to refine the magnetostrictive coupling of the magnetostrictor material.

FIG. 1 shows an example embodiment of a magnetostrictor assembly 100 in accordance with certain embodiments of the present disclosure. The magnetostrictor assembly 100 may be disposed, for example, in or on the exterior of a downhole tubular string assembly (not shown). The tubular string assembly may be a drill string suspended in a well bore by a derrick, a completion assembly, a work string, a tool string, coiled tubing, wireline, or any other oilfield tubular. The magnetostrictor assembly 100 may be disposed in other types of wells and systems, however, including systems where fluid is injected into a formation, produced from a formation, or circulated in the well (such as during drilling operations), where fluid passes from a relatively high pressure source to a relatively low pressure zone within a well, or where fluid flows from a pump or other "artificial" pressure source, etc. Thus, the principles of the present disclosure are not limited to applications where fluid is to be produced through a tubular string or from a well.

In certain embodiments, the magnetostrictor assembly 100 may include a vortex shedding device 101, which, in the embodiment shown, features a substantially flat upper surface and a triangular shape. The vortex shedding device 101 may, however, take a variety of shapes and sizes. The vortex shedding device 101 may be known to those skilled in the art as a "bluff body," a more general term that encompasses devices that have a significant pressure drag at some point in their range of motion. The term bluff body encompasses vortex shedding devices as well as aeroelastic, fluidic, and hydrodynamic devices that experience flutter, oscillation, and galloping. The vortex shedding device 101 may be attached at one end of an elongated beam 102. The elongated beam 102 may be attached at its other end to transfer arm 103 and a flexure member 106. The transfer arm 103 may include rounded caps 104 that may be in contact with, but not attached to, one end of magnetostrictor elements 105. The magnetostrictor elements 105 may be coupled at their other ends to actuators 107. Magnetostrictor elements 105 may also be disposed inside a housing, as will be discussed below. As will also be discussed below, actuators 107 may impart a compressive preload onto the magnetostrictor elements 105. Actuators 107 and flexure member 106 may be further attached to a base 108, which can itself be attached to a tubular assembly when the magnetostrictor assembly 100 is deployed, thereby anchoring each of the elements.

The discussion of the vortex shedding device 101 is not meant to limit the magnetostrictor assembly 100. Other methods could be used for converting the energy in the fluid flow into elastic energy in the magnetostrictor elements 105. Flutter or galloping oscillations could be used instead of vortex shedding. In addition, a rotational structure such as a turbine blade on a shaft could be used to convert the fluid motion into mechanical motion. The discussion on the vortex shedding device is intended to be illuminative not limiting.

FIG. 1 shows a direction of fluid flow relative to the magnetostrictor assembly 100 via arrows 109. The fluid flow 109 may impinge on the flat surface of the vortex shedding device 101. As the fluid impinges on the vortex shedding device 101, the vortex shedding device 101 may shed vortices at a regular and alternating interval—one to the left of the vortex shedding device 101, then one to the right of the vortex shedding device 101, etc.—producing alternating lift forces on the vortex shedding device 101 and the beam 102. The alternating lift forces cause the device, including flexure member 106, to displace laterally back and forth, as represented by arrows 110. Preferably, the device 101 and arm 103 are more rigid than flexure 106, so that the primary pivot point of the lateral movement is at the flexure member 106.

The lateral vibrational displacement of the beam 102 may cause the transfer arm 103 to impart strain on, or to compress, magnetostrictor elements 105. In certain embodiments, the rounded caps 104 may be attached to the transfer arm 103 and may act as an intermediary between the transfer arm 103 and the magnetostrictor elements 105. The rounded caps 104 prevent rotational loads from being transferred to the magnetostrictor elements 105, instead transferring only longitudinal loads. In other embodiment, the rounded caps 104 may be replaced with a leveraging element in order to obtain a better mechanical impedance match between the transfer arm 103 and the magnetostrictor elements 105.

Figure 2:
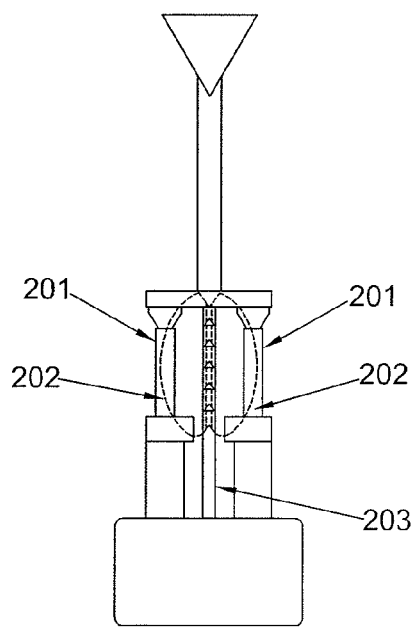
FIG. 2 is an illustration of an example magnetostrictor assembly incorporating aspects of the present disclosure.

The magnetostrictor elements 105 may generate a magnetic field in response to the strain. FIG. 2 illustrates one example of the magnetic field generated by the magnetostrictor elements, represented by magnetic flux lines 202. The magnetic flux lines 202 may be generated at each magnetostrictor element 201 and, as required in a magnetic circuit, may form a closed flux path through flexure 203. As will be discussed below, the magnetic flux 202 created by the magnetostrictor elements 201 can be used to created electrical energy to power a variety of loads, including downhole testing, drilling, and monitoring elements or to be stored in a battery for later use.

Returning to FIG. 1, in certain embodiments, as the beam 102 is displaced laterally back and forth at some frequency, the transfer arm 103 may compresses each magnetostrictor elements 105 in turn. For example, as the beam 102 is displaced laterally toward the right side of magnetostrictor assembly 100, the right magnetostrictor element 105 may be placed under a strain, thereby increasing the strength of the magnetic flux generated by the right magnetostrictor element 105. Conversely, strain that was on the left magnetostrictor element 105 is removed or decreased, thereby decreasing the strength of the magnetic flux generated by the left magnetostrictor element 105. Likewise, when the beam 102 is displaced toward the left, the magnetic flux generated by the left magnetostrictor element 105 increases and the magnetic flux generated by the right magnetostrictor element 105 decreases. Thus, when the magnetostrictor assembly 100 is placed in fluid flow and vibrating, the magnetic flux generated by each magnetostrictor elements 105 may increase and decrease at the same frequency with which the beam 102 is vibrating.

In certain embodiments, the rigidity, or mechanical impedance, of the elongated bean 102 may be substantially similar to the rigidity of the magnetostrictor elements 105. In other embodiments, the rigidity of the flexure member 106 may be substantially similar to the rigidity of the magnetostrictor elements 105. Matching mechanical impedance of the beam 102 or flexure member 106 and the magnetostrictor elements 105 reduces displacement and increases force. If the mechanical impedance were mismatched, for example, the beam 102 could flex more than magnetostrictor elements 105 when under vibrating strain, thereby preventing some of the converted fluid force from being applied to the magnetostrictor elements.

Figure 3:
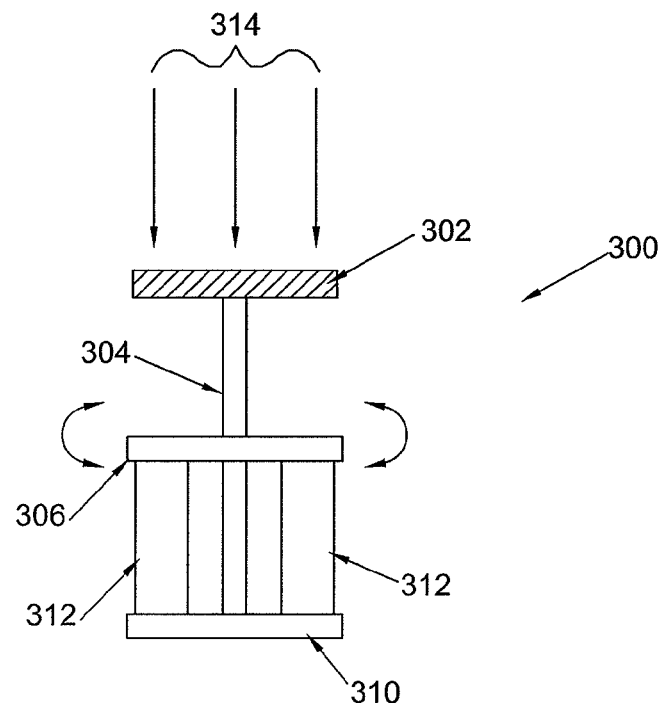
FIG. 3 is an illustration of an example magnetostrictor assembly incorporating aspects of the present disclosure.

FIG. 3 illustrates another embodiment of a magnetostrictor assembly 300, which may be placed directly into fluid flow in a downhole environment. The magnetostrictor assembly 300 may include a turbine 302 connected by a shaft 304 to swashplate 306 and base 310. Disposed between the base 310 and the swashplate 306 may be magnetostrictor elements 312. Magnetostrictor elements 312 may be inside a housing, as will be discussed below. When impinged upon by fluid flow, represented by arrows 314, the turbine 302 may spin, rotating shaft 304. The rotational action of shaft 304 may cause the swashplate 306 to tilt, or wobble, around the shaft 304 in an alternating pattern. Thus, as the turbine 306 spins, the swashplate 306 may first impart strain on, or compress, the magnetostrictor element 312 on the left side of magnetostrictor assembly 300. The swashplate 306 may then tilt the opposite way, removing strain from the left magnetostrictor element 312 and imparting strain on the right magnetostrictor assembly 312. The swashplate 306 may continue imparting strain on in alternating fashion as long as the turbine 302 continues to spin.

In preferred embodiments, the magnetostrictor assemblies shown in both FIGS. 1 and 3 may include elements for applying at least one variable biasing force to the magnetostrictor elements. The variable biasing force may be used to optimize the efficiency of the magnetostrictor elements. The variable biasing force may also be used to reduce the power generated by the magnetostrictor elements. When the frequency of a driver is a function of the rate of rotation of a downhole turbine, such as the turbine shown in FIG. 3, the frequency can get so high that more power is available than is needed, because the voltage is proportional to the rate of change of magnetic flux. If the power is not drawn from the generator, the output level can reach such a level that the downhole electronics are damaged. If the excess power is drawn so as to prevent an over-voltage condition, it must be dissipated somewhere and typically ends up as heat. This heat can (and usually does) adversely affect the downhole electronics. Therefore, it is sometimes desirable to reduce the rate of change of the magnetic flux by controlling the amount of magnetostriction that occurs in each cycle.

Figure 4:
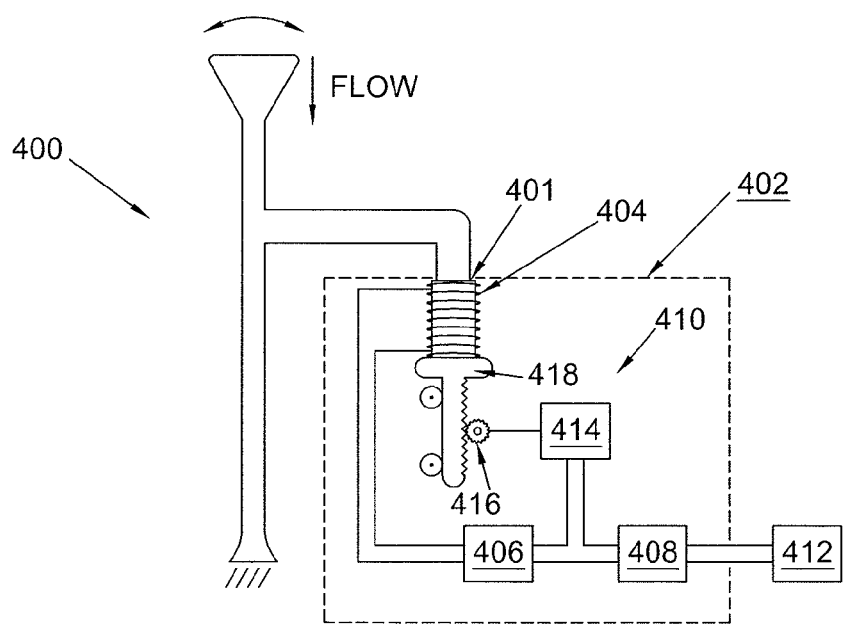
FIG. 4 is an illustration of an example magnetostrictor assembly including a generator with variable biasing elements according to aspects of the present disclosure.

FIG. 4 illustrates one example magnetostrictor assembly 400, which incorporates a preload mechanism 410 for applying a variable biasing force (mechanical stress) to magnetostrictor element 401 to reduce the ability of a magnetostrictive generator to reduce power. The magnetostrictor assembly 400 may be coupled to an example generator 402, according to aspects of the present disclosure, for converting the magnetic flux of the magnetostrictor element 401 into direct current (DC) electrical power. The generator 402 may be coupled to a load 412. The generator 402 may include a coil of wire 404 wrapped around magnetostrictor element 401, a rectifier 406, and an accumulator 408. In certain embodiments, the generator 402 may further include a preload mechanism 410.

As the magnetic flux generated by the magnetostrictor element 401 increases and decreases due to the vibration of the magnetostrictor assembly 400, an alternating current (AC) may flow through the coil of wires 404. To convert the AC to DC, the coil of wires 404 may be attached to a rectifier 406. The rectifier 406 may include a plurality of capacitors, diodes, and other well known components in the art to convert AC to DC. Converting the AC to DC is beneficial because many downhole components, such as sensors, use DC, but conversion is not required.

The rectifier output may be split, with some of the DC power flowing to the accumulator 408 and some DC power flowing to the preload mechanism 410. The accumulator 408 may comprise batteries, capacitors, or other electrical elements for storing the DC power produced by generator 402. In some embodiments, the accumulator 408 is necessary because the generator 402 may go through periods when it does not produce power, such as when fluid flow is stopped, and electrical elements, such as the load 412 in FIG. 4, may still require power to operate. In other embodiments, the accumulator 408 may be removed or may be located elsewhere and not included as a part of the generator 402. In those instances, the output of the rectifier 406 may be connected directly to load elements or to storage elements located remotely.

The preload mechanism 410 may be used as a feedback mechanism to tune and vary the amount of power generated by the magnetostrictor element 401. Without the preload mechanism 410, the generator 402 could create too much power, which can destroy sensitive elements, such as capacitor and diodes, within the rectifier 406 or in other electronic loads connected to the rectifier. The preload mechanism 410 may also be used to optimize power generation by optimizing the impedance match between the magnetostrictor elements and the elongated beam of a magnetostrictor assembly.

In certain embodiment, preload mechanism 410 may include a stepper motor 414 coupled to a gear assembly 416, which may include a rack and pinion configuration, and an actuator 418, which may include a compression platform. In other embodiments, the preload mechanism may be a solid state actuator such as a piezoelectric, ferroelectric, or another magnetostrictor, a DC motor, a thermal expansion-based actuator, hydraulic actuator, or any other method of adjusting the force. The preload mechanism 410 may use some of the DC power output by the rectifier 406 to power the stepper motor 414.

In some embodiments, at low amplitudes, i.e., when the fluid flow is at a low velocity, the preload mechanism 410 may place the magnetostrictor element 401 at a preload stress by using the stepper motor to force the compression platform upwards into the magnetostrictor element 401. By way of non-limiting example, the preload stress may be 1 kilo-pound per square inch (ksi). When the amplitude is increased, i.e., the velocity of the fluid flow increases, the magnetic flux change is larger and faster, leading to an increase in the power generated at the coils 404 and rectifier 406. The preload mechanism 410 may receive this increase in power from the rectifier 406 and respond by increasing the preload stress. By way of non-limiting example, the preload stress may be increased to 8 ksi. In some embodiments, the preload mechanism may include a logic device that directs the stepper motor to increase pressure on the magnetostrictor elements when the preload mechanism receives power above a certain threshold.

Figure 5:
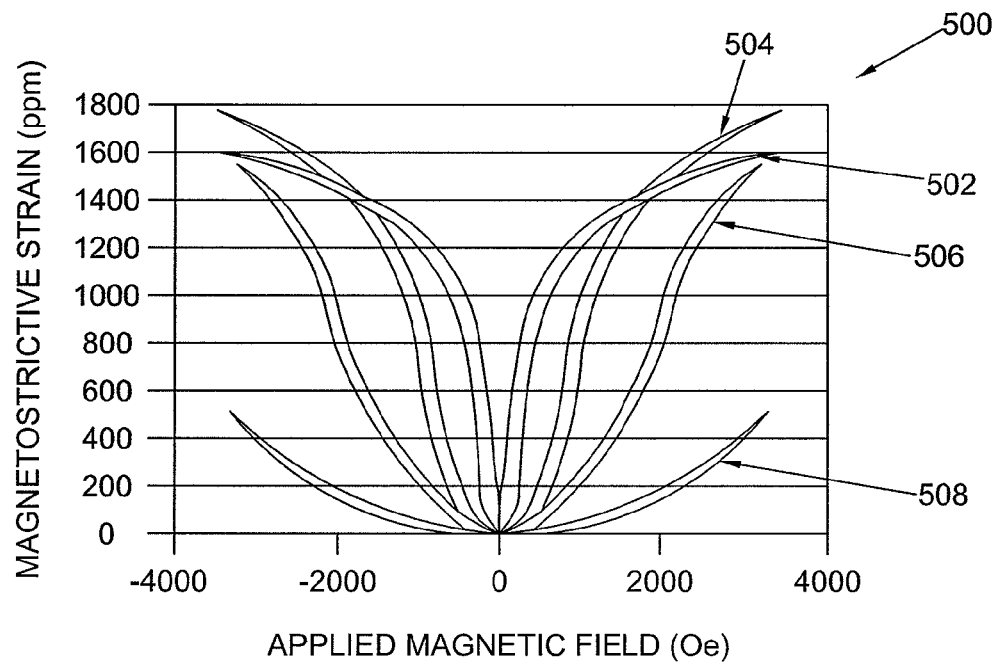
FIG. 5 is a chart depicting the applied magnetic field versus magnetostrictive strain when a magnetostrictive element is under different preloads.

FIG. 5 is a non-limiting illustrative chart 500 depicting the applied magnetic field versus magnetostrictive strain when a magnetostrictive element is under different preloads. Curves 502, 504, 506, and 508 respectively correspond to preloads of 1 ksi, 4 ksi, 8 ksi, and 16 ksi. As indicated by curve 504, by increasing the preload stress to 4 ksi, the change in the magnetic field relative to the additional stress will be more gradual (a shallower slope), decreasing the amount of current flowing through the coils 404, which, in turn, decreases the amount of power produced at the rectifier 406. Thus, when the power received at the rectifier 406 becomes too great, or passes some pre-determined threshold, the preload mechanism 410 may respond, decreasing the power generated and protecting the rectifier 406 components. Likewise, if the amplitude is increased even further, the preload mechanism 410 may apply even more pre-load pressure, e.g., 8 ksi. Although particular pre-load levels are mentioned as possible values, these values should not be seen as limiting. Rather, the pre-load levels may depend on the type and configuration of magnetostrictor materials selected. Additionally, although only four pre-load stress levels are identified, other embodiments may utilize any suitable number of levels to increase the precision with which the generator is tuned.

Figure 6:
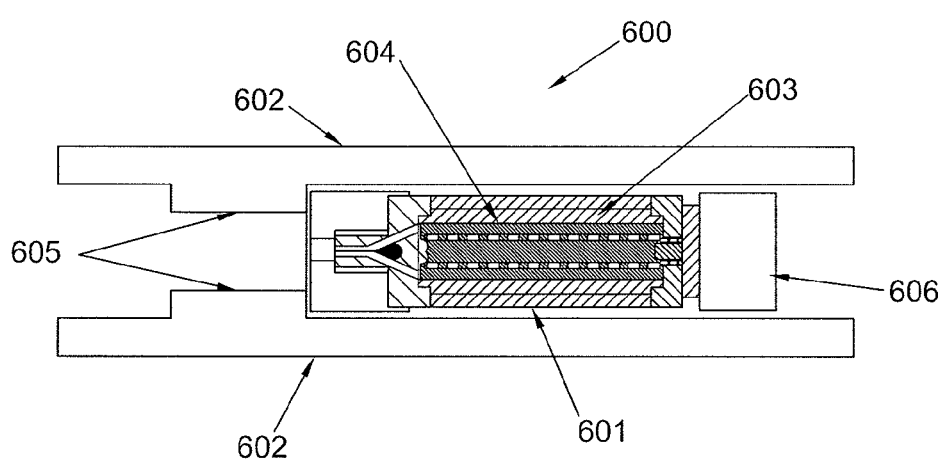
FIG. 6 illustrates an example magnetostrictive element in a housing according to aspects of the present disclosure.

FIG. 6 illustrates a close-up view of a magnetostrictive element assembly 600, in accordance with certain embodiments of the present disclosure. The magnetostrictive element assembly 600 may include a housing 602 for a magnetostrictive element 601. The magnetostrictive element 601 may include a body 603 that includes a coil of wire 604. The body 603 may be compressed against a shoulder 605 of the housing 602 by the piston 606. In some embodiments, the shoulder 605 and piston 606 may be used to pre-compress the magnetostrictive elements 601 for optimization purposes, as will be discussed below. In other embodiments, the housing 602 may be used in either of the magnetostrictive assemblies illustrated in FIGS. 1 and 3, and the piston 606 may be part of the stepper motor/actuator assembly shown in FIG. 4. Additionally, the piston 606 may be unconnected to a stepper motor/actuator assembly and instead respond to pressure variations, e.g., via vortex shedding, in a wellbore by altering the pressure applied to the magnetostrictive element 601.

Figure 7:
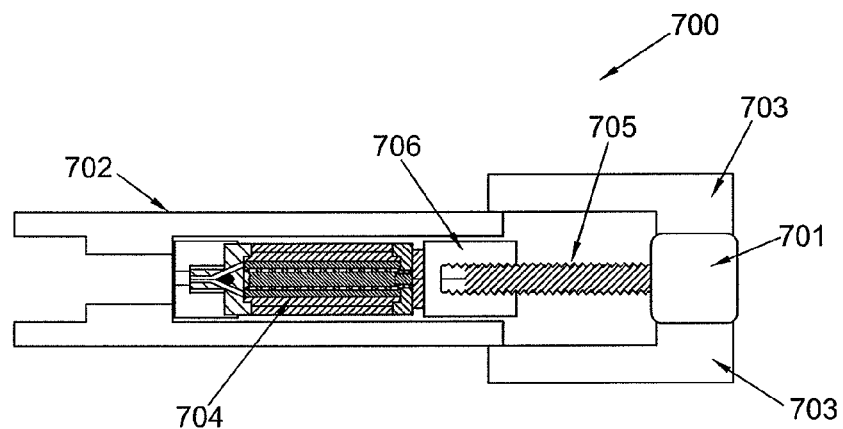
FIG. 7 illustrates an example magnetostrictive element in a housing according to aspects of the present disclosure.

FIG. 7 illustrates a magnetostrictive element and worm gear assembly 700, in accordance with certain embodiments of the present disclosure. In the alternative embodiment of assembly 700, the stepper motor assembly of FIG. 4 may be replaced with a reversible, rotary DC motor 701 shown in FIG. 7. The motor 701 may include a gear box and drive wires, and may be coupled to the housing 702 using motor mounts 703. The motor 701 may compress the magnetostrictive element 704 using a worm gear 705 and piston 706.

Figure 8:
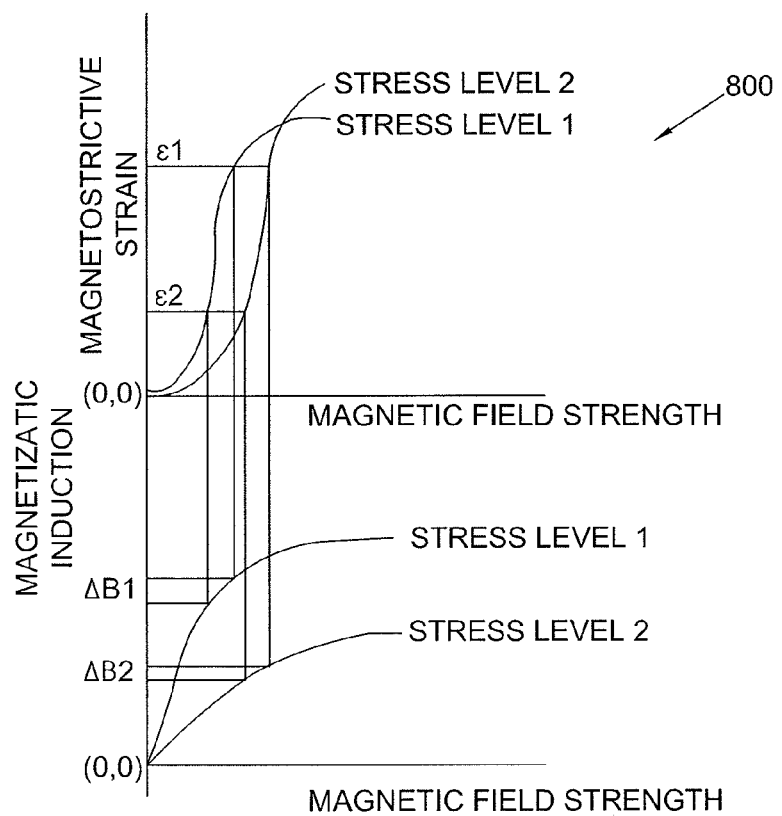
FIG. 8 is a chart depicting the change in magnetostrictive strain and magnetic induction versus magnetic field strength when magnetostrictive material is under a preloaded stress.

In addition to restricting the amount of power generated at a magnetostrictive generator, imparting a preload stress to the magnetostrictor element may optimize the efficiency of a magnetostrictor element. In one embodiment, the preload stress can be imparted by applying compression to the magnetostrictor element. FIG. 8 shows exemplary curves 800 to illustrate how the efficiency of a magnetostrictor element varies with the applied (static or DC) stress level. In particular, curves of magnetostrictive strain as a function of the magnetic field strength, and of magnetic induction as a function of the magnetic field strength are shown in FIG. 8 for two static stress levels, Stress Level 1 and Stress Level 2. If the system is subjected to static Stress Level 1 and is cycled from strain level $\epsilon 1$ to $\epsilon 2$, there is a resulting change in magnetic induction of $\Delta B1$. Likewise, if the system is subjected to static Stress Level 2 and is cycled from the same strain levels $\epsilon 1$ and $\epsilon 2$, the resulting change in magnetic induction is $\Delta B2$. In the example, $\Delta B2 < \Delta B1$, but the relation can be changed by altering the static stress level. Thus, by controlling the static stress level, it is possible to control the change in magnetizatic induction (i.e., flux density) and hence the rate of change of flux for a given frequency of operation.

As can be seen in FIG. 8, strain applied to the system at a given static stress level results in a certain magnetic field strength. The magnetic field strength at that stress level results in a magnetic induction. However, the static stress can actually arise from an applied magnetic field. This can be understood from Equations (1) and (2):

$$\varepsilon = \frac{\sigma}{E_y^H} + d_{33}H, \qquad \text{Equation (1)}$$

$$B = d_{33}^*\sigma + \mu^\sigma H \qquad \text{Equation (2)}$$

In the above expressions, $\epsilon$ is the strain, $\sigma$ is the stress, $Ey^H$ is the Young's modulus at constant magnetic field strength (not magnetic induction), $d_{33}$ is the change in strain per unit change in the magnetic field strength at a constant stress ("piezomagnetic coefficient"), $d^*_{33}$ is the change in magnetic induction (not magnetic field strength) per unit change in stress at a constant magnetic field strength, H is the magnetic field strength, B is the magnetic induction, and $\mu^\sigma$ is magnetic permeability at constant stress.

A relationship exists between the Young's modulus at a constant applied field strength, $Ey^H$ and the Young's modulus at a constant magnetic induction, $Ey^B$, as may be given by the following Equation (3).

$$Ey^H = Ey^B(1 - k_{cc}^2) \qquad \text{Equation (3)}$$

$k_{cc}$ is known as the magnetocoupling coefficient. It is important to note that $k_{cc}$ is a real number bounded between 0 and 1. Thus, $Ey^H$ can never be more than $Ey^B$. Since the parameters $d_{33}$, $d^*_{33}$, and $\mu^\sigma$ are themselves functions of stress and magnetic field strength, the actual variation of the Young's modulus with stress and strain can be very complicated.

The Young's modulus as a function of the stress exhibits a minimum, the location of which is a function of the applied static magnetic field strength. The actual minimum values of the Young's modulus are an increasing function of the applied magnetic field strength that is slower than linear. That is, the rate of increase in the minimum value of the Young's modulus decreases with increasing field strength.

Figure 9:
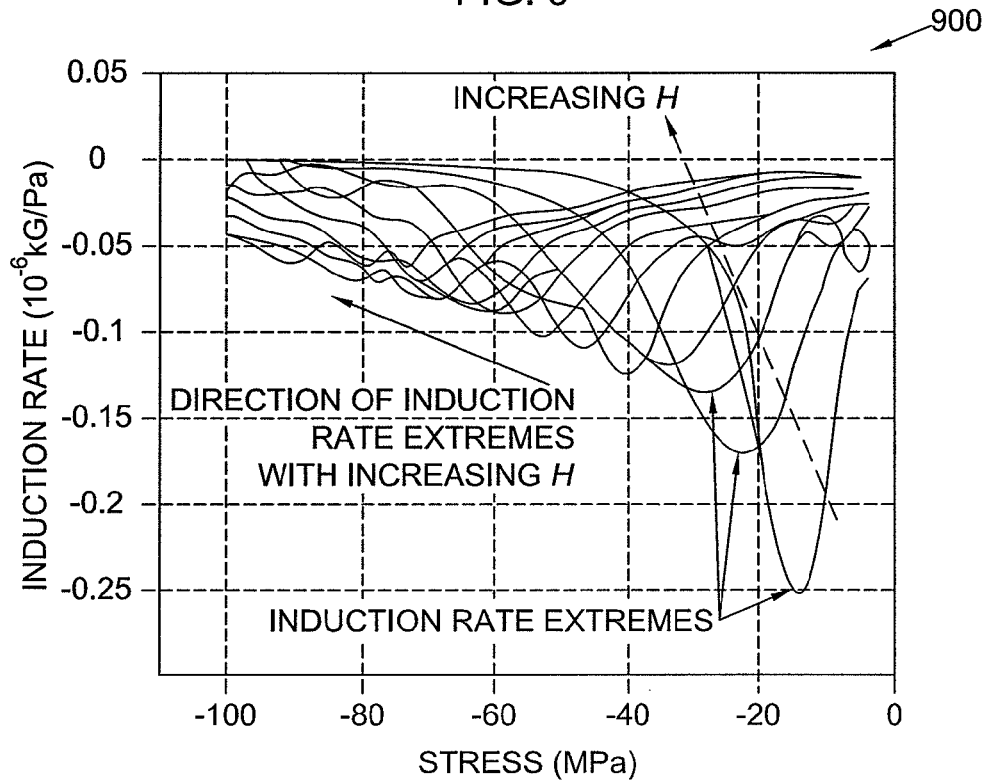
FIG. 9 is a chart depicting the induction rate of a magnetostrictive element versus stress on the magnetostrictive element.

Similarly, the magnitude of the magnetization strain rate (rate of change of magnetic strain with stress) as a function of stress may experience a maximum that is a function of the applied static magnetic field strength. There is a linear relationship between the compressive stress level at which the magnetization strain rate is maximum and the compressive stress level at which the Young's modulus is minimum. The actual maximum magnetization strain rate decreases with the strain and is a less than linear function of the strain at which the maximum occurs, as can be seen in FIG. 9 herein. FIG. 9 is a chart 900 depicting the induction rate of a magnetostrictive element versus stress on the magnetostrictive element Since all of the variables and parameters are inter-dependent, the phenomena described above should be considered to be an approximation that is good for large levels of cyclic loading. If the level of cyclic loading is small compared to the static load, larger apparent Young's moduli are observed than for cyclic loading approaching the magnitude of the static load.

When optimizing magnetostrictive elements for maximum efficiency, it may be desirable to operate with the highest practically achievable magnetostrictive strain rate, as this will result in the largest change of flux for a given cycle of strain and hence the largest obtainable electrical power from that cycle. In the example where the cyclic stress is induced by the motion of a swashplate, as in FIG. 3, the change in stress and the change in strain may be the same for each cycle. It may not advisable to subject a magnetostrictive material to cyclic strains beyond a certain level, for example without limitation, $1.5*10^{-3}$ for Terfenol-D. This sets a limit for the amount of strain that can be applied. Assuming that the ambient magnetic field is negligible, the static stress on the device may be pre-set to the observed maximum of induction rate vs. stress using the information in FIG. 5 for Terfenol-D, or a similar relationship obtained for a different magnetostrictive material. With Terfenol-D, one non-limiting example of the appropriate static stress may be 15 MPa (about 2 ksi).

Figure 10:
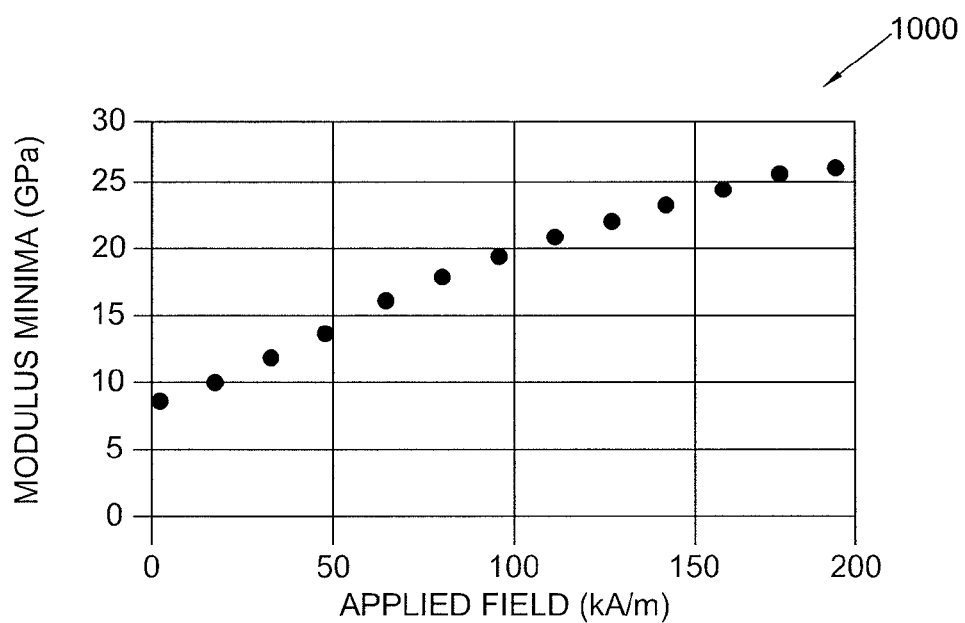
FIG. 10 is a chart depicting the modulus minima for an applied magnetic field on a magnetostrictive element.

FIG. 10 is a chart 1000 depicting the modulus minima for an applied magnetic field on a magnetostrictive element. The Young's modulus at a static stress level of 15 MPa may be obtained as indicated by FIG. 10, using 0 for the applied field value, and may be 9 GPa. Thus, by way of example without limitation, the cyclic stress may be no more than 13.5 MPa ($9*1.5*10^{-3}$). Referring back now to FIG. 9, the magnetization strain rate at this operating point is $0.25*10^{-6}$ kGauss/Pa. Multiplying this by 13.5 MPa, one obtains 3,375 Gauss (0.3375 Tesla).

Suppose by way of non-limiting example, however, that a pre-stress of 15 MPa is not sufficient to keep the Terfenol-D under compression during downhole vibration or bending. The efficiency may be optimized at a higher stress level by imposing a magnetic field on the Terfenol-D rod so as to bring it to a maximum induction rate. The same analysis can then be carried out to determine the cyclic field change.

A magnetic field to optimize the efficiency of a magnetostrictive generator may be supplied by either a static magnet or by a feed back mechanism, re-routing a portion of the power generated by the magnetostrictive generator to a set of coils wound around the magnetostrictive element. The static magnet approach may require good control over the production of the static magnet and may be preferred in conditions where the temperature and stress levels are tightly controlled. Otherwise, the second approach may be preferred. The second approach may be carried out adaptively without a detailed knowledge of the relationships referred to above between the induction rate, stress and magnetic field strength of the magnetostrictive element.

Figure 11:
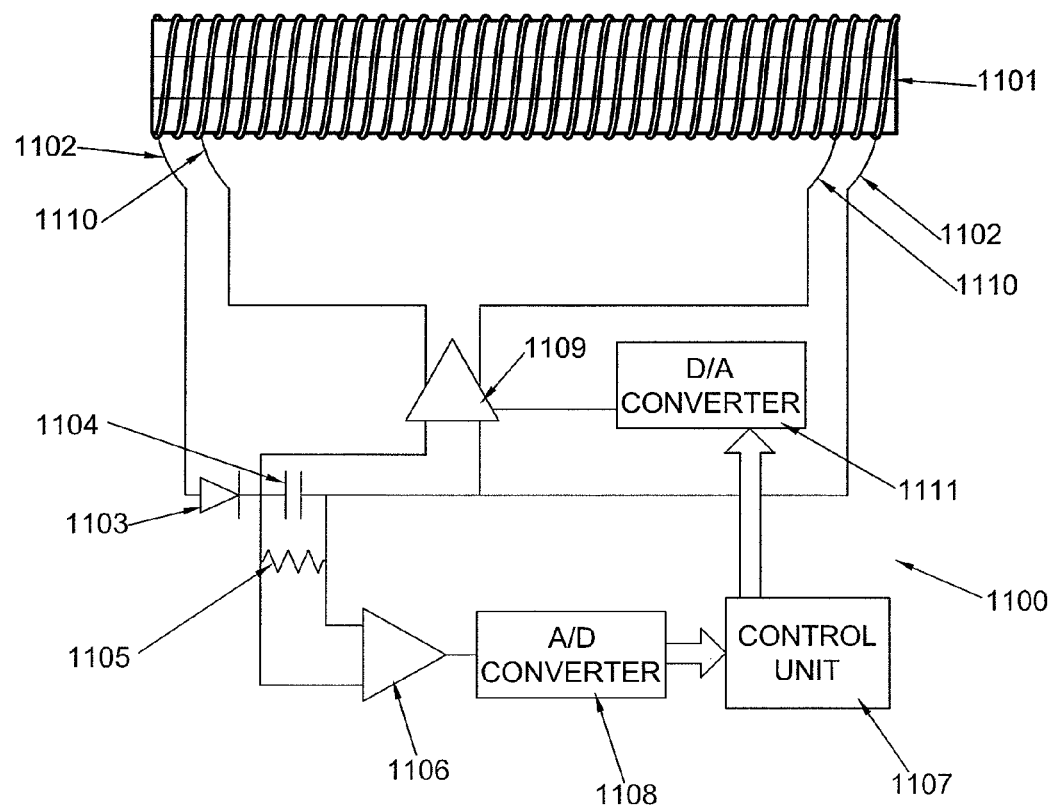
FIG. 11 illustrates an example biasing assembly incorporating magnetic feedback biasing according to aspects of the present disclosure.

FIG. 11 illustrates one embodiment of a control circuit 1100 for optimizing a magnetostrictive generator using magnetic feedback from the magnetostrictive element 1101, in accordance with certain embodiments of the present disclosure. The magnetostrictive element 1101 in FIG. 11 may be subjected to the pre-determined static stress needed for safe operation of the unit. As the magnetostrictive element 1101 is cyclically driven as, e.g., through a swashplate in FIG. 3, a voltage may develop across a first coil 1102 that may be wrapped around the magnetostrictive element 1101. The cyclic stress gives rise to a cyclic magnetic field that may be rectified and filtered using diode 1103, capacitor 1104, and resistor 1105. The rectified and filtered voltage may be input to an operational amplifier 1106 that is input to a control unit 1107 via an A/D converter 1108. The filtered output of the rectifier may also be sent to a variable gain power amplifier 1109 that may drive a second coil 1110 wrapped around the magnetostrictive element 1101. The control unit 1107 may step the gain of the variable gain amplifier 1109 (via the D/A converter 1111) through a sufficient number of settings so as to determine approximately at what setting a maximum output is observed at the A/D converter 1108. The procedure may then be refined as, e.g., by centering a search interval to bracket the setting of maximum output, halving the width of the search interval from the previous interval, and stepping the D/A converter through the same number of steps (sometimes referred to as a binary search). The initial search range can be pre-defined to be from zero to the maximum power available, or it can be pre-defined based on measured properties of the magnetostrictive material and on the desired static strain level.

In still other embodiments, the magnetic bias device shown in FIG. 11 may be included with or substituted for the preload mechanism shown in FIG. 4. By combining the magnetic biasing of FIG. 7 and the mechanical preload mechanism of FIG. 4, a magnetostrictive generator would be able to both optimize the efficiency of power generation while still protecting against overproduction when fluid flow velocity changes result in spikes of electricity.

In certain embodiments according to the present disclosure, the magnetostrictive elements may be of a laminated construction. A given magnetostrictive element may comprise the magnetostrictive material in the form of stacked laminated plates. Such a construction may be used to minimize the eddy currents. Fewer eddy currents would allow for less loss, especially at higher oscillation frequencies.

This device can be positioned in a bottom hole assembly to power down hole devices such as MWD/LWD and steering assemblies. It can also be placed throughout the drill string to power communications repeaters, sensors and actuators like fluid sampling and sensing devices in a distributed manner. Such repeaters can be wired pipe repeaters such as in IntelliServ's wired drill pipe system or electromagnetic telemetry repeaters, acoustic repeaters, mud pulse repeaters or other forms of telemetry repeaters.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Also, the terms in the claims have their plain, ordinary meaning unless otherwise explicitly and clearly defined by the patentee. The indefinite articles "a" or "an," as used in the claims, are defined herein to mean one or more than one of the element that the article introduces.

What is claimed is:

1. A magnetostrictor assembly comprising:
   a magnetostrictor element;
   a conductor coupled to the magnetostrictor element;
   a bluff body coupled to the magnetostrictor element via a transfer arm, the bluff body to be placed in a fluid flow path to, at least in part, produce motion that, at least in part, causes strain in the magnetostrictor element, wherein the strain induces an electric current in the conductor; and
   a preload mechanism
       coupled to the magnetostrictor element to apply a preload stress on the magnetostrictor element and to adjust the induced electric current in response to an amount of power generated by the magnetostrictor element, and
       comprising a control circuit to apply a second stress on the magnetostrictor element in response to the amount of power generated by the magnetostrictor element.

2. The magnetostrictor assembly of claim 1, wherein the bluff body is a vortex shedding device.

3. The magnetostrictor assembly of claim 1, wherein the motion comprises flutter or galloping.

4. The magnetostrictor assembly of claim 1, wherein the magnetostrictor element comprises a stack of laminated plates, each laminated plate comprising magnetostrictive material.

5. The magnetostrictor assembly of claim 1, wherein the motion comprises an alternating motion that, at least in part, causes alternating forces to be transferred to the magnetostrictor element via the transfer arm.

6. The magnetostrictor assembly of claim 5, wherein the alternating forces are longitudinal with respect to the magnetostrictor element.

7. The magnetostrictor assembly of claim 1, wherein the second stress on the magnetostrictor element reduces the amount of power generated by the magnetostrictor element.

8. The magnetostrictor assembly of claim 1, wherein the second stress on the magnetostrictor element increases an efficiency of the magnetostrictor element.

9. The magnetostrictor assembly of claim 1, wherein the preload mechanism comprises a motor drivingly coupled to an actuator to compress the magnetostrictor element.

10. The magnetostrictor assembly of claim 1, wherein the preload mechanism comprises a motor drivingly coupled to a worm gear and a piston to compress the magnetostrictor element.

11. The magnetostrictor assembly of claim 1, further comprising a magnet coupled to the magnetostrictor element to increase an efficiency of the magnetostrictor element.

12. The magnetostrictor assembly of claim 1, further comprising:
a flexure member coupled between the bluff body and a base, wherein the flexure member allows the bluff body to move relative to the base.

13. The magnetostrictor assembly of claim 1, further comprising:
a second magnetostrictor element disposed generally opposite the magnetostrictor element;
wherein the motion comprises an alternating motion that, at least in part, causes alternating forces to be transferred to the magnetostrictor element and the second magnetostrictor element via the transfer arm.

14. A method to generate electrical energy from fluid flow energy, the method comprising:
providing a magnetostrictor element;
providing a conductor coupled to the magnetostrictor element;
providing a preload mechanism coupled to the magnetostrictor element to apply a preload stress on the magnetostrictor element and to adjust an electric output of the conductor in response to an amount of power generated by the magnetostrictor element, wherein the preload mechanism comprises a control circuit to apply a second stress on the magnetostrictor element to adjust the electric output of the conductor in response to the amount of power generated by the magnetostrictor element; and
applying the preload stress and the second stress to the magnetostrictor element.

15. The method to generate electrical energy from fluid flow energy of claim 14, further comprising:
providing a bluff body coupled to the magnetostrictor element via a transfer arm; and
placing the bluff body to be placed in a fluid flow path to, at least in part, produce motion that, at least in part, causes strain in the magnetostrictor element.

16. The method to generate electrical energy from fluid flow energy of claim 14, wherein the second stress on the magnetostrictor element reduces the amount of power generated by the magnetostrictor element.

17. The method to generate electrical energy from fluid flow energy of claim 14, wherein the second stress on the magnetostrictor element increases efficiency of the magnetostrictor element.

* * * * *